United States Patent [19] [11] 4,255,709
Zatsepin et al. [45] Mar. 10, 1981

[54] DEVICE FOR PROVIDING AN ELECTRICAL SIGNAL PROPORTIONAL TO THE THICKNESS OF A MEASURED COATING WITH AN AUTOMATIC RANGE SWITCH AND SENSITIVITY CONTROL

[76] Inventors: Nikolai N. Zatsepin, ulitsa A. Kulmana, 15, kv. 203; Viktor F. Siljuk, ulitsa Gorkogo, 143, kv. 22; Ivan I. Malko, ulitsa Shirokaya, 36, kom. 315-B, all of Minsk; Valentin A. Kaloshin, Kronshtadsky bulvar, 43, korpus 3, kv. 271, Moscow; Valery M. Aniskovich, Krasivy proezd, 5, Minsk; Nikolai N. Naumenko, ulitsa Litovskaya, 30, korpus 2, kv. 10, Minsk; Vladimir V. Perfiliev, ulitsa Gogolya, 14-a, kv. 12, Khimki Moskovskoi oblasti, all of U.S.S.R.

[21] Appl. No.: 944,976

[22] Filed: Sep. 22, 1978

[51] Int. Cl.³ .................. G01B 7/06; G01R 15/10; G01R 15/08
[52] U.S. Cl. .................. 324/229; 324/115; 324/132; 324/225
[58] Field of Search ............ 324/229, 230, 231, 115, 324/132; 307/350, 229, 358, 360; 328/146, 150, 115–117; 364/573, 852

[56] References Cited
U.S. PATENT DOCUMENTS

| 3,536,998 | 10/1970 | Nordholm | 324/115 |
| 3,549,998 | 12/1970 | Fluegel | 324/132 |
| 3,636,338 | 1/1972 | Abnett et al. | 364/852 |
| 4,122,529 | 10/1978 | Hoech | 364/852 |

OTHER PUBLICATIONS

Markus, Source Book of Electronic Circuits, pub. in 1968 by McGraw-Hill, Inc., pp. 362–363.

Gruenberg, "Hand Book of Telemetry and Remote Control" pub. in 1967 by McGraw-Hill, Inc., pp. 3–23.
"Instruments for Non–Destructive Inspection Developed at the Institute of Introscopy", Zavodshaya Laboratoria, No. 6, vol. 40, 1974.
Rluyeva et al., "Electromagnetic Instrument MIP-10 for Measuring Thickness of Non–Ferromagnetic Coatings on Ferromagnetic Base", Defectoscopia No. 6, 1971, pp. 118–119.
Darofeev et al., "Thickness Measurement of Coatings by Means of Eddy Currents," STS Priborprom, Public Institute 1975, pp. 43–45.

Primary Examiner—Gerard R. Strecker
Assistant Examiner—Walter E. Snow
Attorney, Agent, or Firm—Holman & Stern

[57] ABSTRACT

A device for measuring the thickness of coatings, wherein a thickness gauge is electrically coupled to a circuit intended to convert the electric signal at the output of said thickness gauge into an electric signal proportional to the thickness of the coating. The conversion circuit comprises a peak detector whose output is electrically coupled to inputs of an automatic measurement range switching unit and a subtractor. Another input of the automatic measurement range switching unit is connected to an output of a reference voltage forming unit, its one output is electrically coupled to another input of the subtractor, another output is connected to an input of an adder, whereas a third output is electrically coupled to an input of a measuring sensitivity control unit. An output of the subtractor is connected to another input of the measuring sensitivity control unit whose output is connected to another input of the adder. The output of the adder serves as the output of the conversion circuit and is connected to recorder.

4 Claims, 7 Drawing Figures

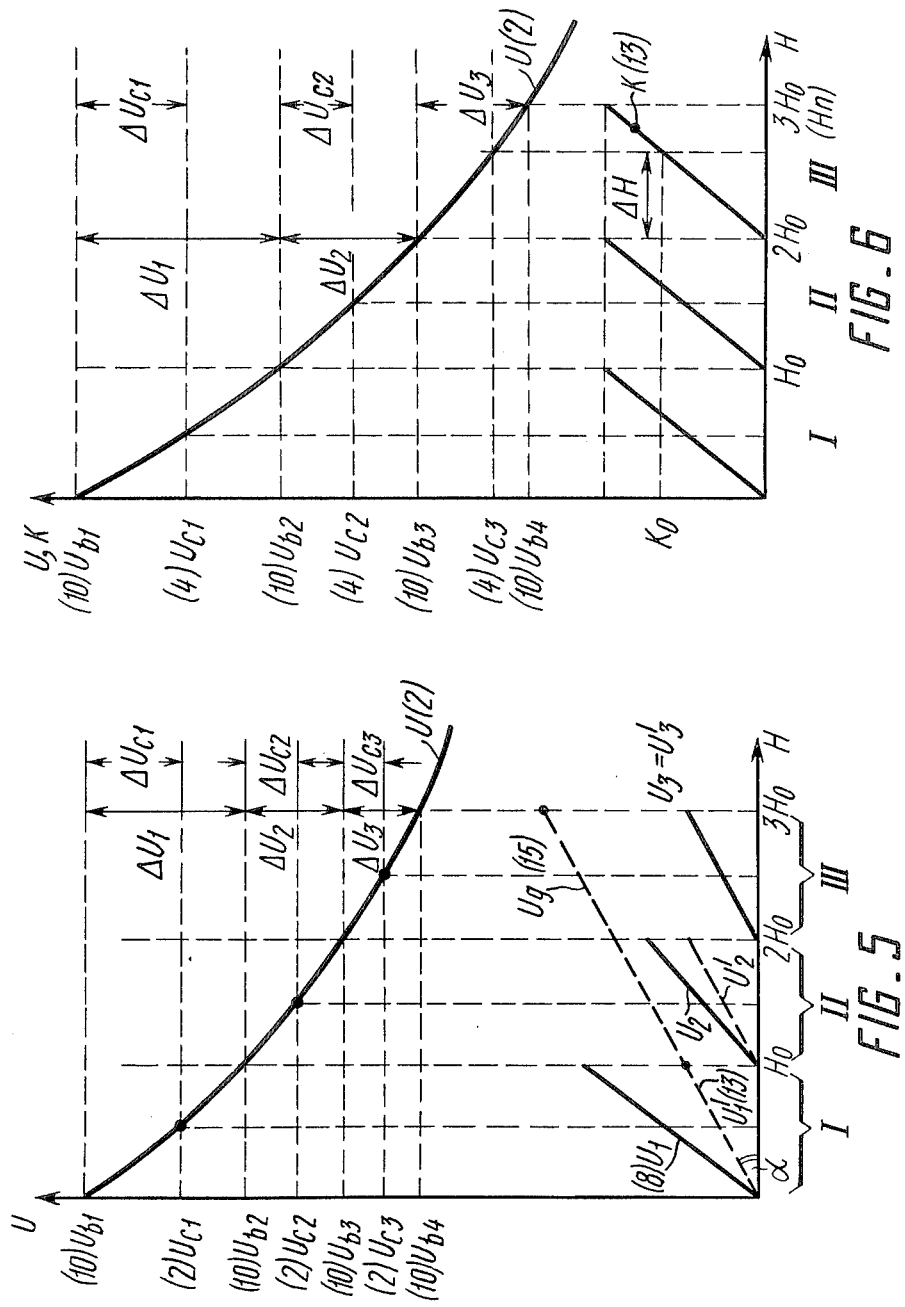

DEVICE FOR PROVIDING AN ELECTRICAL SIGNAL PROPORTIONAL TO THE THICKNESS OF A MEASURED COATING WITH AN AUTOMATIC RANGE SWITCH AND SENSITIVITY CONTROL

FIELD OF THE INVENTION

The present invention relates to process instrumentation and, more particularly, to a device for measuring the thicknesses of dielectric, nonmagnetic and current-carrying coatings applied onto articles of different materials. The invention is readily applicable to metallurgy and general engineering where it can be used for measuring the thickness of sheet materials.

BACKGROUND OF THE INVENTION

Each manufactured article is normally provided with a coating. There are anticorrosive coatings which protect articles from the effects of aggressive media. There are special-purpose coatings which impart certain mechanical or electric properties to an article, such as current-carrying properties, a certain friction coefficient, increased hardness, a certain degree of thermal conductivity, etc. Finally, there are decorative coatings intended to give an article an attractive appearance. The quality of an article is largely determined by the thickness and uniformity of the coating, wherefore each coating application method necessitates rapid coating thickness measurements preferably taken right in the course of the production process. Non-destructive checking of the thickness of coatings makes it possible to improve a number of specific properties of coatings and reduce excessive consumption of coating materials, especially of precious metals and rare elements, which accounts for the fact that thickness measurements become part and parcel of coating application processes. Coating thickness measurements must go hand in hand with data processing and allow automation of the measuring process.

There are a number of different types of thickness gauges used to measure the thickness of coatings. These include electromagnetic, magnetic, radioisotope, ultrasonic, and other types of gauges. Electromagnetic and radioisotope thickness gauges are the commonest. The field of application of radioisotope thickness gauges is limited by the presence of a radioisotope source which requires special skills and precautions on the part of the personnel. Another limitation lies in the fact that there is a specific relationship, i.e. a specific calibration curve for each coating-base combination. As to the development of electromagnetic methods, there have been two basic trends in this field in recent years. The first trend is the development of new types of thickness gauges and new data conversion techniques, as well as improvement of the existing data conversion techniques. The second trend is automation of measuring processes.

Despite a variety of engineering approaches, the existing devices for measuring the thickness of coatings have been unable to meet the stringent accuracy requirements imposed by the industry. Almost all the existing thickness gauges feature a non-linear dependence between the readings of the instrument and the thickness being measured. As a result, a thickness gauge must be provided with nonlinear scales in a number corresponding to that of measurement ranges. This is true of such instruments as М ИП-10 (cf. V. V. Kluyev et al., Electromagnetic Instrument for Measuring the Thickness of Nonferromagnetic Coatings on Ferromagnetic Bases, Defectoscopia, No. 6, 1971, 118); the above consideration applies to nondestructive inspection instruments of the MT-20H, MT-30H and BT-30H models developed at the Institute of Introscopy in the Soviet Union (cf. Zavodskaya laboratoriya, No. 6, 1974, p. 761); the above consideration also applies to such thickness gauges as ULTRAMETR A-9 and A-51 manufactured in Poland (cf. St. Sekowski, Nowe warstwomierze type A-9, A-51, Mechanik, No. 5, 1974, p. 306), PERMASCOPE and ISOSCOPE manufactured by Helmut Fischer of the Federal Republic of Germany and ELEKTROTEST and MONIMETR manufactured by Institut Dr. F/örster of the Federal Republic of Germany (cf. Monimeter 2,094, Maschine und Werkzeug, No. 13, 1975, 76, p. 32). The foregoing disadvantage accounts for limited application of the existing types of thickness gauges. Another disadvantage of the conventional thickness gauges is a varying degree of accuracy in different measurement ranges; in fact, there may be variations in the accuracy even within a single measurement range.

The latter disadvantage is partially eliminated in the thickness gauges of the GIL-41 model manufactured in Poland and MICRO-DERM MD-3 model manufactured by UPA of the United States. These thickness gauges employ sets of interchangeable scales. Scales for different measurement ranges are interchangeable strips placed on the needle indicator of the instrument. The use of interchangeable scales involves a number of difficulties and does not make it possible to automate measuring processes because each scale must correspond to certain base and coating standards. Digital thickness gauges, for example, the gauge of the MT-40H Ш type (cf. A. L. Dorofeyev and G. A. Lyubashov, "The Use of Eddy Currents for Coating Thickness Measurements", Machinostroyeniye Publishers, Moscow, 1975, in Russian) employ a highly sophisticated data conversion system, based on time-pulse conversion of signals; despite the complexity of this system, the measurement process is automated only to a limited extent. Most of the existing instruments necessitate a preliminary measurement of the coating thickness so as to select the measurement range, which requirement further impedes automation of measuring processes.

There is known a device for measuring the thickness of coatings, wherein an electric signal generator is connected to a thickness gauge which is electrically coupled to a conversion circuit intended to convert an electric signal at the output of the thickness gauge to an electric signal of a magnitude proportional to the thickness of the coating being measured, the conversion circuit comprising, in turn, a reference voltage forming unit electrically coupled to a subtractor and connected to a recorder (cf. the above-mentioned М ИП-10 model).

The device under review is intended for measuring the thickness of current-carrying nonmagnetic coatings of such materials as copper, zinc, tin and chromium, and of dielectric nonmagnetic coating of such materials as lacquers, varnishes, films and paints, applied onto articles of ferro-magnetic materials. The operating principle of the device is based upon measuring the permeance over the gauge-ferro-magnetic base (article) portion. Output voltage of the thickness gauge is a function of the distance between the gauge and article and is indicative of the coating thickness. The conversion circuit of the device under review further includes an auxiliary amplifier, a two-stage amplifier and an emitter follower. The subtractor is a gain-phase detector.

From the output of the thickness gauge, voltage is applied via the amplifier to one of the inputs of the subtractor. A signal corresponding to the selected measurement range is applied from the reference voltage forming unit to the second input of the subtractor. Subtraction is performed, and the difference signal is sent to the recorder. The desired measurement range is selected by the operator by switching the reference voltage and appropriately adjusting the gain.

As the instruments discussed above, this device, too, has a number of disadvantages. These include a nonlinear dependence between the readings of the thickness gauge and the thickness of the coating being measured; as a result, there are four nonlinear measurement ranges, which accounts for variations in the measuring sensitivity from range to range. A serious inconvenience is the necessity of a preliminary rough estimation of the thickness to be measured and an appropriate selection of a measurement range, as well as the necessity of adjusting the instrument for each working range with reference to a number of points. These requirements completely rule out automation of the measuring process. The presence of the gain-phase detector makes readings of the instrument dependent upon phase oscillation.

SUMMARY OF THE INVENTION

It is an object of the present invention to provide a device for measuring the thickness of coatings, featuring automatic selection and switching of measurement ranges and marked by a high accuracy of measurements within each range.

It is another object of the invention to expand the functional potentialities of the device for measuring the thickness of coatings.

The invention essentially consists in providing a device for measuring the thickness of coatings, wherein a thickness gauge is connected to an electric signal generator and electrically coupled to a conversion circuit intended to convert an electric signal at the output of the thickness gauge to an electric signal proportional to the thickness of the coating being measured, which conversion circuit comprises, in turn, a reference voltage forming unit electrically connected to a subtractor, and is connected to a recorder, the device being characterized, in accordance with the invention, in that the conversion circuit for converting a signal at the output of the thickness gauge to an electric signal of a magnitude proportional to the thickness of the coating being measured further includes a peak detector whose input serves as the input of the conversion circuit, whereas its output is electrically coupled to an input of the subtractor, an automatic measurement range switching unit having one of its inputs electrically coupled to the output of the peak detector, a second input of the automatic measurement switching unit being connected to an output of the reference voltage forming unit, whereas its output is electrically coupled to a second input of the subtractor, a measuring sensitivity control unit whose first input is connected to the output of the subtractor, while its second input is connected to the second input of the automatic measurement range switching unit, an adder whose inputs are connected to a third output of the automatic measurement range switching unit and to an output of the measuring sensitivity control unit, an output of the adder serving as the output of the conversion circuit.

It is expedient that the conversion circuit for converting a signal at the output of the thickness gauge to an electric signal proportional to the thickness of the coating being measured should include a unit for discriminating the upper level of the working measurement range, its first input being connected to a second output of the reference voltage forming unit, its second input being connected to the output of the automatic measurement range switching unit, its output being connected to the input of the subtractor, a unit for discriminating the lower level of the working measurement range, its first input being connected to a third output of the reference voltage forming unit, its second input being connected to the output of the automatic measurement range switching unit, an auxiliary subtractor having one of its inputs connected to the output of the unit for discriminating the upper level of the working measurement range and its second input connected to the output of the unit for discriminating the lower level of the working measurement range, the measuring sensitivity control unit being essentially built around a voltage divider, the output of the peak detector being electrically coupled to the input of the reference voltage forming unit.

It is advisable that the conversion circuit for converting a signal at the output of the thickness gauge to an electric signal proportional to the thickness of the coating being measured should include a unit for compensating the effects of the derivative sign of the thickness gauge characteristic, its one input being connected to the output of the peak detector, its second input being connected to a fourth output of the reference voltage forming unit, whereas its output is connected to the outputs of the main subtractor, the automatic measurement range switching unit and the reference voltage forming unit.

It is also expedient that the measuring sensitivity control unit should comprise a double-section input voltage divider whose input is the input of the measuring sensitivity control unit, two single-channel input electronic switches of different types of conductivity, connected to a respective section of the voltage divider, a threshold element with reference voltage applied to its one input, its second input being connected to an input of the voltage divider, whereas its output is connected to control inputs of the single-channel input electronic switches, a signal amplifier whose one input is connected to outputs of the single-channel input electronic switches, another input is connected to the ground via a resistor and to its output via another resistor, a single-channel electronic switch whose input is connected to the output of the amplifier, a second threshold element whose one input is connected to the output of the single-channel electronic switch and the output is connected to the control input of said switch, an integrator with a electronic switch connected in its negative feedback loop, whose input serves as the input of the measuring sensitivity control unit, the control input of the electronic switch being connected to the output of the second threshold element and the output being connected to another input of said threshold element, a second integrator with an electronic switch connected in its negative feedback loop and reference voltage being fed to its input, the control input of the electronic switch being connected to the output of the second threshold element, a peak detector whose input is connected to an output of the second integrator, a double-section output voltage divider having its input connected to the output of the peak detector, two single-channel output electronic switches of different types of conductivity, each having its input connected to a respective section of the output voltage divider and control inputs connected to the output of the first threshold element and outputs combined to serve as the output of the measuring sensitivity control unit.

BRIEF DESCRIPTION OF THE ACCOMPANYING DRAWINGS

Other objects and advantages of the present invention will become more apparent from the following detailed description of preferred embodiments thereof, taken in conjunction with the accompanying drawings, wherein:

FIG. 5 is a graph illustrating the voltage at the output of the thickness gauge, voltages at the outputs of the subtractor, measuring sensitivity control unit and adder against the thickness of the coating being measured, in accordance with the invention;

FIG. 6 is a graph illustrating the voltage at the output of the thickness gauge against the thickness of the coating being measured, and the ratio between voltages at the outputs of the subtractors, in accordance with the invention;

DETAILED DESCRIPTION OF THE INVENTION

Figure 1:
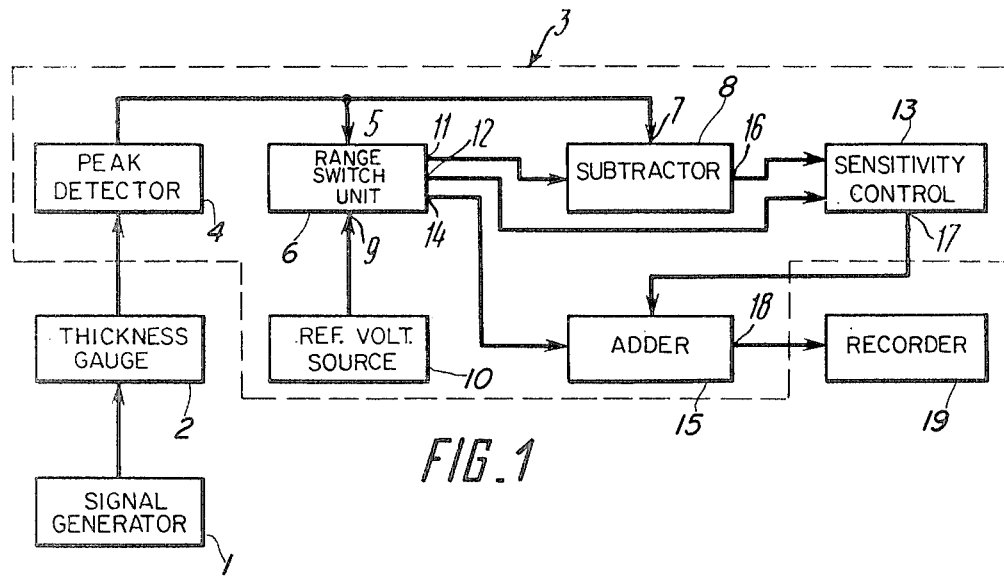
FIG. 1 is a block diagram of the proposed device for measuring the thickness of coatings, in accordance with the invention.

According to the invention, the device for measuring the thickness of coatings comprises an electric signal generator 1 (FIG. 1) connected to a thickness gauge 2 which converts the thickness being measured to an electric signal. Depending on a specific application, the device according to the invention may employ different types of thickness gauges, for example, electromagnetic, microwave, ultrasonic, etc. Apart from measuring the thickness of dielectric coatings applied onto metal articles and nonmagnetic electrodeposits on ferromagnetic articles, the device according to the invention, complete with an appropriately selected thickness gauge, is capable of handling such a complicated problem as thickness measurements on nonmagnetic current-carrying coatings applied onto articles of nonmagnetic current-carrying materials.

The thickness gauge 2 is electrically coupled to a conversion circuit 3 intended to convert an electric signal at the output of the thickness gauge 2 to an electric signal of a magnitude proportional to the thickness of the coating being measured. The input of the conversion circuit 3 is that of a peak detector 4 which is electrically coupled to an input 5 of an automatic measurement range switching unit 6 and an input 7 of a subtractor 8. The automatic measurement range switching unit 6 is intended to automatically (i.e. without any interference on the part of the operator) select and switch on a desired working range. Applied to a second input 9 of the automatic measurement range switching unit 6 are reference voltages sent from a reference voltage forming unit 10. An output 11 of the automatic measurement range switching unit 6 is electrically coupled to the input of the subtractor 8; an output 12 of the automatic measurement range switching unit 6 is connected to an input of a measuring sensitivity control unit 13; an output 14 of the automatic measurement range switching unit 6 is connected to an adder 15.

The measuring sensitivity control unit 13 is meant to adjust the sensitivity so as to ensure equal sensitivities within each working range.

An output 16 of the subtractor 8 is connected to the input of the measuring sensitivity control unit 13 whose output 17 is connected to an input of the adder 15. An output 18 of the adder 15 is the output of the conversion circuit 3 and connected to an input of a recorder 19. The latter is intended to display the thickness of the coating being measured, represented in the decimal or some other code, in micrometers; it also provides for data input to a numeric printer or computer. When necessary, the recorder 19 may give an alarm signal if the coating thickness exceeds predetermined limits.

Consider now an alternative embodiment of the device in accordance with the invention, which is basically similar to the one described above. The alternative embodiment is presented in FIG. 2.

Figure 2:
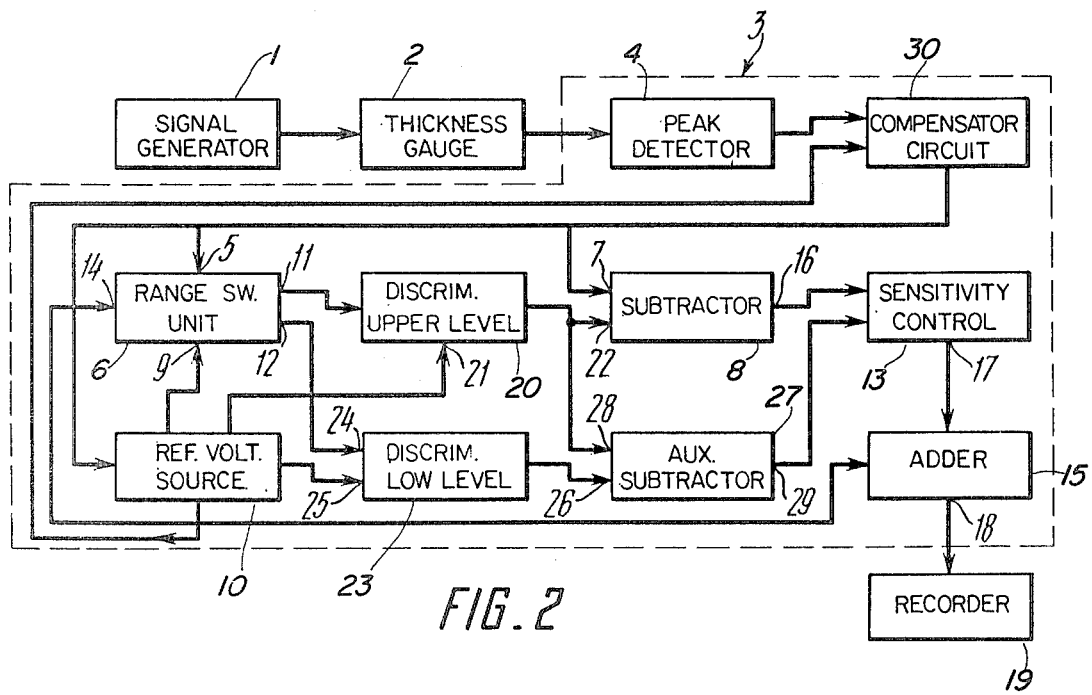
FIG. 2 is a block diagram of an alternative embodiment of said device, in accordance with the invention.

In the device of FIG. 2, the electric signal conversion circuit 3 comprises a unit 20 (FIG. 2) for discriminating the upper level of the working measurement range, its input being connected to the output 11 of the automatic measurement range switching unit 6. A second input 21 of the unit 20 is connected to the output of the reference voltage forming unit 10; an output of the unit 20 is connected to an input 22 of the subtractor 8. The conversion circuit 3 further includes a unit 23 for discriminating the lower level of the working range, its input 24 being connected to the output 12 of the automatic measurement range switching unit 6; an input 25 of the unit 23 is connected to the output of the reference voltage forming unit 10; an output of the unit 23 is connected to an input 26 of an auxiliary subtractor 27. A second input 28 of the subtractor 27 is connected to the output of the unit 20 for discriminating the upper level of the working range.

The subtractor 8 is intended for subtraction of the working range upper level voltage applied to its input 22, and voltage at the output of the peak detector 4, applied to the input 7. The subtractor 27 is intended to subtract working range upper and lower level voltages applied to its inputs 28 and 26, respectively.

The output 16 of the subtractor 8 and an output 29 of the subtractor 27 are connected to the mesuring sensitivity control unit 13. The latter is essentially built around a voltage divider.

The output of the peak detector 4 is electrically coupled to the input of the reference voltage forming unit 10.

As a rule, the dependence of the characteristic of an electromagnetic thickness gauge on the coating thickness being measured is presented by a nonlinear drop-down curve which is close to the hyperbolic. However, for some coating-base combinations the characteristic of the thickness gauge is expressed by a nonlinearly rising curve. The derivative sign may help to determine the type of dependence; thus in order to expand the potentialities of the device according to the invention, the conversion circuit 3 includes a unit 30 for compensating the effects of the derivative sign of the thickness gauge characteristic, its first input being connected to the output of the peak detector 4, its second input being connected to the output of the reference voltage forming unit, whereas an output of said unit 30 is connected to the input 7 of the subtractor 8, the input 5 of the automatic measurement range switching unit 6 and the input of the reference voltage forming unit 10.

In the device of FIG. 1, the peak detector 4 (FIG. 3) comprises an operational amplifier 31 with a diode 32 and a resistor 33 placed in its negative feedback loop. An output of the operational amplifier 31 is connected via a common point of connection of a diode 34 and capacitor 35 to a non-inverting input of an operational amplifier 36. The capacitor 35 also connects the non-inverting input of the operational amplifier 36 to the ground. The operational amplifier 36 is a signal follower, its output being the output of the peak detector 4 and being connected to non-inverting inputs of operational amplifiers 37, 38 and 39 which serve as the input 5 of the automatic measurement range switching unit 6.

Inverting inputs of the operational amplifiers 37, 38 and 39 serve as the input 9 of the automatic measurement range switching unit 6 and are connected to respective outputs of the reference voltage forming unit 10. Thus, the operational amplifiers 37, 38 and 39 operate as threshold elements whose trigger levels are set by the reference voltage forming unit 10.

An output of the operational amplifier 37 is connected to control inputs 40 of multichannel electronic switches 41, 42, 43 and 44. The electronic switches 41, 42 and 44 are incorporated in the automatic measurement range switching unit 6; the electronic switch 43 is incorporated in the measuring sensitivity control unit 13. An output of the operational amplifier 38 is connected to a control input 45 of the electronic switch 42 and via a resistor 46 to an input 47 of said electronic switch 42 and control inputs 47 of the electronic switches 41, 43 and 44.

An output of the operational amplifier 39 is connected via a resistor 48 to control inputs 49 of the electronic switches 41, 43 and 44 and a diode 50 connected to a non-inverting input of an operational amplifier 51 of the adder 15. An output 52 of the electronic switch 42 is grounded. An output 53 of the electronic switch 44 is connected to a non-inverting input of an operational amplifier 54 of the adder 15. An input 55 of the electronic switch 44 is connected to a movable contact of an adjustable resistor 56. The adjustable resistor 56 and resistors 57 and 58 make up a voltage divider. An input 59 of the electronic switch 44 is connected to a movable contact 57 of said voltage divider of the reference voltage forming unit 10. An input 60 of said electronic switch 44 is grounded.

An input 61 of the electronic switch 41 is connected to a movable contact of an adjustable resistor 62. The resistor 62 and a resistor 63 make up a voltage divider of the reference voltage forming unit 10. An input 64 of the electronic switch 41 is connected to a movable contact of an adjustable resistor 65. The adjustable resistor 65 and a resistor 66 make up a voltage divider. An input 67 of said electronic switch 41 is connected to a movable contact of an adjustable resistor 68. The adjustable resistor 68 and a resistor 69 also make up a voltage divider.

An output of the electronic switch 41 is the output 11 of the automatic measurement range switching unit 6 and is connected to the subtractor 8.

The subtractor 8 comprises an operational amplifier 70 whose non-inverting input is the input of said subtractor 8. The operational amplifier 70 is a signal follower. The subtractor 8 further includes an operational amplifier 71 whose non-inverting input is connected to an output of the operational amplifier 70. An inverting input of said operational amplifier 71 serves as the input 7 of the subtractor 8 and is connected to the output of the operational amplifier 36 of the peak detector 4. An output of the operational amplifier 71 is the output 16 of the subtractor 8 and is connected to the common input of the electronic switch 43 of the measuring sensitivity control unit 13.

As stated above, the measuring sensitivity control unit 13 comprises the electronic switch 43 with its common input. Placed at its outputs are adjustable resistors 72, 73 and 74 and a resistor 75 which make up a resistor voltage divider with a discretely variable conversion factor. The common point of the resistors 72, 73, 74 and 75 is the output 17 of the measuring sensitivity control unit 13.

As stated above, the reference voltage forming unit 10 is built around resistor voltage dividers, wherein the resistors 56, 57 and 58 are connected to the inputs 55 and 59 of the electronic switch 44, the resistors 62 and 63 are connected to the input 61 of the electronic switch 41, and the resistors 65 and 66 are connected to the input 64 of the electronic switch 41 and the inverting input of the operational amplifier 37. The resistors 68 and 69 are connected to the input 67 of the electronic switch 41 and the inverting input of the operational amplifier 38. The resistors 76 and 77 make up the voltage divider of the reference voltage forming unit 10 and are connected to the inverting input of the operational amplifier 39.

A common point 78 of the voltage divider is connected via a resistor 79 to the negative pole of a stabilized voltage source and via a VR tube 80 to the ground.

The output 17 of the measuring sensitivity control unit 13 is connected to the inverting input of the operational amplifier 51 of the adder 15 which also includes the operational amplifier 54 constructed as a signal follower. The output of the operational amplifier 54 is connected to the inverting input of the operational amplifier 51. The non-inverting input of the operational amplifier is grounded, whereas its output is the output 18 of the adder 15 and the output of the entire conversion circuit 3.

As pointed out above, the embodiment of FIG. 2 is basically similar to that of FIG. 1.

Figure 3:
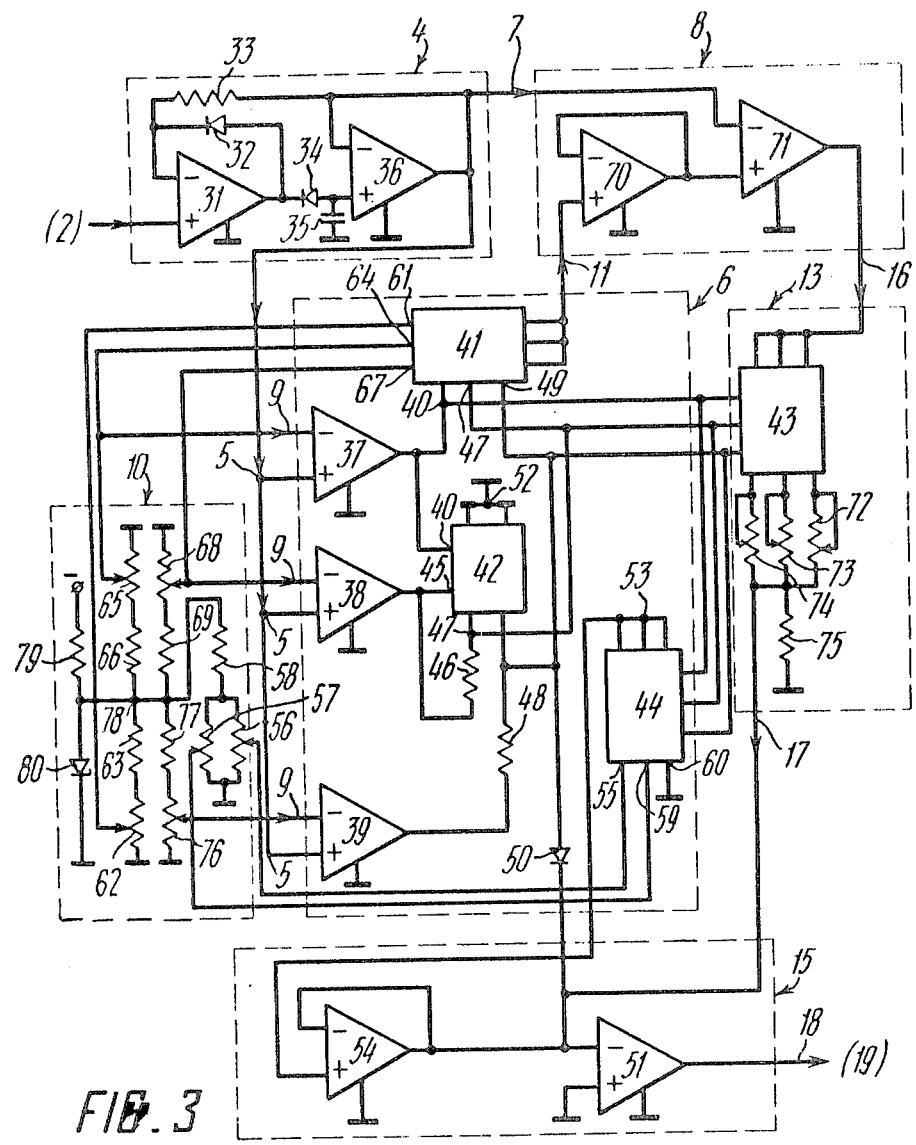
FIG. 3 is a key diagram of the device of FIG. 1.

The difference between the two lies in the fact that the device of FIG. 2 additionally includes the units 20 (FIG. 2) and 23 for discriminating the upper and lower levels, respectively, of the working range. The units 20 and 23 are of a conventional circuitry and built around multichannel electronic switches. The auxiliary subtractor 27 is similar to the subtractor 8 (FIG. 3). The measuring sensitivity control unit 13 includes an operational amplifier 81 (FIG. 4) which is a threshold element. An inverting input of the operational amplifier 81 is the input of the measuring sensitivity control unit 13 and is connected to the output of the subtractor 8. A non-inverting input of the operational amplifier 81 is connected to a reference (negative) voltage source. An output 82 of the operational amplifier 81 is connected to control inputs of single-channel input electronic switches 83, 84 and single-channel output electronic switches 85, 86. Each electronic switch in the pairs 83 and 84, 85 and 86 is of a different type of conductivity. An input of the electronic switch 83 is connected to the inverting input of the operational amplifier 81. An input 87 of the electronic switch 84 is connected to a voltage divider comprising resistors 88 and 89 of which the latter is grounded. The input of the electronic switch 83 is also connected to that of the voltage divider. A common input 90 of the electronic switches 83 and 84 is connected to a non-inverting input of an operational amplifier 91 whose inverting input is connected via a resistor 92 to the ground and via a resistor 93 to the output of the operational amplifier 91 which is connected to the input of a single-channel electronic switch 94. An output of the electronic switch 94 is connected to the inverting input of an operational amplifier 95 which is a second threshold element and via a resistor 96 to the ground. Control inputs of single-channel electronic switches 94, 97, 98 are connected to an output 99 of the operational amplifier 95 whose non-inverting input is connected to an output 100 of an operational amplifier 101 around which the first integrator is built. The output 100 of the operational amplifier 101 is also connected via a capacitor 102 to its inverting input which is further connected to the output 100 of the operational amplifier 101 via the electronic switch 97 placed in its negative feedback loop. The control input of the electronic switch 97 serves as the control input of the integrator. The inverting input of the operational amplifier 101 is connected via a resistor 103 to the second input of the measuring sensitivity control unit 13, whereto a signal is applied from the output of the subtractor 27. The non-inverting input of the operational amplifier 101 is grounded. One output of a resistor 104 is connected to a stabilized (positive) reference voltage source and another output is connected to the inverting input of an operational amplifier 105 around which a second integrator is built. The inverting input of the operational amplifier 105 is connected via a capacitor 106 and the electronic switch 98 placed in the negative feedback loop to an output 107 of said operational amplifier 105. The control input of the electronic switch 98 is the control input of the second integrator. A non-inverting input of the operational amplifier 105 is grounded.

A non-inverting input of an operational amplifier 108 is connected to the output 107 of the operational amplifier 105. An inverting input of the operational amplifier 108 is connected via a diode 109 to its output which is connected via a diode 110 to a non-inverting input of an operational amplifier 111. The operational amplifiers 108 and 111 make up a peak detector. The non-inverting input of the operational amplifier 111 is connected via a capacitor 112 to the ground. An inverting input of the operational amplifier 111 is connected via a resistor 113 to the inverting input of the amplifier 108 and directly to the output 114 which is directly connected to the input of the single-channel output electronic switch 85 and via a resistor 115 to an input 116 of the single-channel output electronic switch 86. The input 116 of the electronic switch 86 is connected via a resistor 117 to the ground. The common output of the electronic switches 85 and 86 is the output 17 of the measuring sensitivity control unit 13 and is connected to the input of the adder 15.

The device for measuring the thickness of coatings in accordance with the invention operates as follows.

The thickness gauge 2 (FIG. 1) serves to convert the thickness of the coating being measured to an electric signal to be applied to the input of the peak detector 4. From the peak detector 4, the detected signal is applied to the input 5 of the automatic measurement range switching unit 6 and to the input 7 of the subtractor 8. From the reference voltage forming unit 10 to the second input 9 of the automatic measurement range switching unit 6 there are applied voltages setting the levels at which the range switching is to take place. According to the magnitude of the input signal, the automatic measurement range switching unit 6 selects a reference voltage corresponding to a given working range and applies it to the input of the subtractor 8. From the output of the subtractor 8 the signal, produced as a result of subtracting the voltage at the output of the peak detector 4 from the selected reference voltage, is applied to the measuring sensitivity control unit 13 which ensures equal sensitivities in all the working ranges. From the output 17 of the measuring sensitivity control unit 13, the signal is applied to the input of the adder 15 where it is added to a voltage proportional to the measurement range selected by the automatic measurement range switching unit 6. The signal produced at the output 18 of the adder 15 is applied to the recorder 19.

The device of FIG. 3 operates as follows.

Output voltage of the thickness gauge 2, carrying information on the thickness of the coating under investigation, is applied to the input of the peak detector 4. During the negative half-period the diode 32 in the negative feedback loop of the operational amplifier 31 is closed and the capacitor 35 is quickly charged via the diode 34. The voltage is applied from the capacitor 35 via the signal follower of the operational amplifier 36 and the resistor 33 to the inverting input of the operational amplifier 31. When the voltage at the capacitor becomes equal to amplitude value of the input voltage the charge of the capacitor is discontinued. During the positive half period the voltage at the capacitor 35 remains practically unaltered, since the diode 34 is closed. The diode 32 becomes conductive and protects the operational amplifier 31 from overloading. Negative voltage equal to the amplitude value of the detected voltage is produced at the output of the operational amplifier 36.

The output voltage of the peak detector 4 is applied to the input 5 of the automatic measurement range switching unit 6. The input 5 is the common point of connection of the non-inverting inputs of the operational amplifiers 37, 38 and 39 which operate as threshold elements.

For better understanding of operation of the device for measuring the thickness of coatings in accordance with the invention, consider FIG. 5 which is a graph showing the dependence of voltage U at the output of the thickness gauge 2 on the thickness H of the coating under investigation. H is plotted on the abscissa and U is laid off on the y-axis. FIG. 5 also shows voltages $U_1$, $U_2$ and $U_3$ at the outputs of the subtractor 8; voltages $U'_1$ and $U'_2$ at the output of the measuring sensitivity control unit 13; and voltage $U_g$ at the output of the adder 15.

The entire thickness measurement area is divided into a number of zones so that a maximum error due to nonlinearity should not be in excess of a maximum permissible value. For reasons of simplicity, FIG. 5 shows only three zones $H_o$ of an equal size.

From the reference voltage forming unit 10 (FIG. 3), reference voltage $U_{b2}$ (FIG. 5), $U_{b3}$ and $U_{b4}$ are applied to the inverting inputs of the operational amplifiers 37 (FIG. 3), 38 and 39. The reference voltages are formed with the aid of the resistor voltage dividers. The divider built around the resistors 65 (FIG. 3) and 66 sets the trigger level of the operational amplifier 37, i.e. the level of switching the first range. The voltage $U_{b2}$ is also applied to the input 64 of the electronic switch 41. The divider built around the resistors 68 and 69 sets the trigger level of the operational amplifier 38, i.e. the second range switching level; the voltage $U_{b3}$ is also applied to the input 67 of the electronic switch 41. The divider built around the resistors 62 and 63 produces voltage $U_{b1}$ at the input 61 of the electronic switch 41. The divider built around the resistors 76 and 77 produces voltage $U_{b4}$ at the inverting input of the operational amplifier 39.

Thus, if the signal $U_c$ (FIG. 5) of the thickness gauge 2 meets this requirement: $U_{b1} > U_{c1} > U_{b2}$, which corresponds to the coating thickness $0 < H < H_o$, the operational amplifiers 37 (FIG. 3), 38 and 39 are brought into play. Through the input 40 of the electronic switch 41, the operational amplifier 37 applies voltage $U_{b1}$ to the output 11 of the automatic maesurement range switching unit 6, wherefrom it proceeds to the input of the subtractor 8. Simultaneously, voltage from the output of the operational amplifier 37 is applied to the control input 40 of the electronic switch 42 and drives it into conduction, whereby the input 47 of the electronic switch 42 is connected to the ground; as a result, through the control input 47 of the electronic switch 41 this voltage cuts off the input 64 of that same switch 41.

Similarly, from the output of the operational amplifier 38, voltage is applied to the control input 45 of the electronic switch 42 to connect the output of the operational amplifier 39 to the ground, i.e. through the control input 49 of the electronic switch 41 this voltage cuts off the input 67 of that same electronic switch 41.

Thus, if $U_{b1} > U_{c1} > U_{b2}$, voltage $U_{b1}$ alone is applied through the input 61 to the output 11 of the automatic measurement range switching unit 6. Apart from voltage $U_{b1}$, to the second input 7 of the subtractor 8 there is applied voltage $U_{c1}$ from the thickness gauge 2; at the output 16 of the subtractor 8 there is produced the difference $U_{b1} - U_{c1} = \Delta U_{c1}$, the maximum value of that difference being $U_{b1} - U_{b2}$.

Thus for the first range, the dependence of the voltage at the output 16 of the subtractor 8 upon the coating thickness is represented by $U_1$ (FIG. 5).

Similarly, when the signal $U_c$ of the thickness gauge 2 meets this condition: $U_{b2} > U_{c2} > U_{b3}$, which corresponds to $H_o < H < 2H_o$, the operational amplifiers 38 (FIG. 3) and 39 are brought into action. From the operational amplifier 38, the signal is applied via the resistor 46 to the input 47 of the electronic switch 42, wherefrom it proceeds to the control inputs 47 of the electronic switches 41 and 43, which is because the operational amplifier 37 is not actuated and the electronic switch 42 does not conduct with its input 40 being cut off.

From the output of the operational amplifier 39, voltage is applied via the resistor 48 to the input of the electronic switch 42 which grounds it through the control input 45 and thus cuts off the inputs 49 of the electronic switches 41 and 43. In this case voltage $U_{b2}$ is applied from the resistor 65 to the output 11 of the automatic measurement range switching unit 6. The subtractor 8 subtracts the signal $U_{c2}$ of the thickness gauge 2 from the voltage $U_{b2}$, so that at its output we have: $U_{b2} - U_{c2} = \Delta U_{c2}$. The maximum possible difference is $U_{b2} - U_{b3}$. Thus $U_2$ (FIG. 5) is obtained for the second range.

Similarly, when $U_{b3} > U_{c3} > U_{b4}$, which corresponds to the coating thickness $2H_o < H < 3H_o$, the operational amplifier 39 (FIG. 3) is actuated. The control inputs 40 and 45 of the electronic switch 42 are cut off, so the control inputs 49 of the electronic switches 41 and 43 are rendered conducting, whereby the electronic switch 41 applies voltage $U_{b3}$ to the output 11 of the automatic measurement range switching unit 6. As this takes place, the subtractor 8 performs this operation: $U_{b3} - U_{c3} = \Delta U_{c3}$; the maximum possible difference is $U_{b3} - U_{b4}$.

Thus $U_3$ (FIG. 5) is obtained for the third range.

It follows from the above that depending on the working range, at the output 16 (FIG. 3) of the subtractor 8 there is produced the difference $\Delta U_{c1}$, $\Delta U_{c2}$ or $\Delta U_{c3}$ which is applied to the common input of the switch 43 of the measuring sensitivity control unit 13. The control inputs of the electronic switch 43 are connected to the control inputs 40, 47 and 49 of the electronic switch 41; according to the working range, the resistors 72, 73 and 74 are connected to the output of the electronic switch 43, which resistors 72, 73 and 74 make up resistor voltage dividers in combination with the resistor 75. With a conversion factor $n_1$ for the first range, at the output 17 of the measuring sensitivity control unit 13 there is produced voltage $$\frac{U_{b1} - U_{c1}}{n_1}$$

which is applied to the inputs of the adder 15. In this case the sensitivity at the output 18 of the adder 15 is as follows:

$$tg\alpha = \frac{\frac{U_{b1} - U_{c1}}{n_1}}{H} = \frac{U_{b1} - U_{b2}}{n_1 H_o} = \text{const.}$$

The above equation means that a linear dependence is produced.

It is possible therefore to use the adjustable resistors 72, 73, 74 to vary the conversion factor. Thus it is possible to have equal sensitivities in the first, second and third ranges, i.e. $U'_1$ (FIG. 5), $U'_2$, $U'_3 = U_3$.

The equal sensitivities for all the ranges:

$$\frac{U_{b1} - U_{b2}}{n_1} = \frac{U_{b2} - U_{b3}}{n_2} = \frac{U_{b3} - U_{b4}}{n_3}$$

for the given type of nonlinear dependence can be used as a basis for calculating the conversion factors of the dividers built around the resistors 72 (FIG. 3), 73, 74 and 75.

With $H > 3H_o$, a positive potential is applied from the output of the operational amplifier 39 via the resistor 48 and diode 50 to the inverting input of the operational amplifier 51 to change the polarity of its output signal; as a result, the recorder 19 indicates "OVERLOAD".

If the signal $U_{c2}$ of the thickness gauge 2 corresponds to the second range, the reading for the second range, i.e. $H_o/2$, must include the thickness of the first range, which means that the true coating thickness value is $H_o + H_o/2$; similarly, for the third range, the second one must be added, i.e. the true coating thickness value for the third range is $2H_o + H_o/2$.

The above operations are performed by the electronic switch 44 whose control inputs are common with the control inputs 40, 47 and 49 of the electronic switches 41 and 43. Depending on the selected working range, voltage is applied to the output 53 of the electronic switch 44 either from the resistor 56 through the input 55 or from the resistor 57 through the input 59; the switch 44 may also be grounded through the input 60. The voltage is applied to the non-inverting input of the operational amplifier 54 which is a signal follower; from the output of the operational amplifier 54, the voltage is applied to the inverting input of the operational amplifier 51 which adds it to the signal arriving from the output 17 of the measuring sensitivity control unit 13. Thus at the output 18 of the adder 15 we have the resulting characteristic $U_g$ (FIG. 5). From the output 18 (FIG. 3) of the adder 15 the signal is applied to the recorder 19 which displays the coating thickness.

Thus it follows from FIG. 5 that the device according to the invention can operate with the use of a single resultant linear scale $U_g$. In the case under review, the sensitivity for each range is $$\gamma = tg\epsilon = \text{const},$$

which means that measurements of any values of the coating thickness H are performed with the same absolute measurement error. If necessary, it is possible to have ranges with arbitrarily chosen beginning and end levels, which is done by setting desired reference voltage values in the threshold elements of the automatic measurement range switching unit 6 (FIG. 2).

The signal of the thickness gauge 2, detected by the peak detector 4, is applied to the input 5 of the automatic measurement range switching unit 6 which is electrically coupled to the peak detector 4. As pointed out above with reference to FIG. 3, the automatic measurement range switching unit 6 selects a working measurement range according to the value of the above-mentioned signal. In most cases, the dependence of the output voltage U of the peak detector 4 upon the coating thickness H is of the type illustrated in FIG. 6, where the coating thickness H is plotted on the x-axis and voltage U is plotted on the y-axis. K is the ratio between voltages at the outputs 16 (FIG. 2) and 29 of the subtractors 8 and 27, respectively, i.e. voltage at the output of the measuring sensitivity control unit 13.

As stated above, the reference voltage forming unit 10 (FIG. 3) forms voltages by measuring voltages $U_{b1}$ (FIG. 6), $U_{b2}$, $U_{b3}$ and $U_{b4}$ and setting the same values at the outputs of the resistor voltage dividers. In the embodiment of FIG. 2, reference voltages may also be formed by successively storing voltages $U_{b1}$, $U_{b2}$, $U_{b3}$ and $U_{b4}$ with the aid of conventional analog storages, such as integrators, etc. Besides, the formation of reference voltages can be effected faster and easier with the use of resistor dividers by employing differential dividers and the recorder of the device instead of precision instruments. For this purpose the output voltages of the resistor dividers are set by applying standard output voltage of the peak detector 4 to one of the inputs of the adder 15 and at the same time applying output voltage of the resistor dividers of the reference voltage forming unit 10 to the other input of said adder 15. Zero reading of the recorder 19 is indicative of an equality of voltages. Upon setting the reference voltage levels, these voltages are applied from the outputs of the reference voltage forming unit 10 to the input 21 of the unit 20 for discriminating the upper level of the working measurement range and to the input 25 of the unit 23 for discriminating the lower level of the working measurement range. Analog storages are preferable in cases of frequent changes of the types of coatings under investigation. If such changes are not frequent resistor units are preferable.

With the use of resistor dividers, thickness measurements of different coatings can be effected by a simple switching of the dividers, as well as by using the same dividers, wherein adjustable resistors incorporate calibrated scales. If calibration charts are available, desired reference voltages can be easily set with the aid of the dividers' scales and without using any measuring instruments. In the embodiment of FIG. 3, the measuring scale is linearized by piecewise approximation of the thickness gauge characteristic, by automatically switching the working ranges, by automatic zero adjustment in each range (at a moment of range switching, the reference voltage of the working range threshold element of the automatic measurement range switching unit 6, the output voltage of the peak detector 4 and the reference voltage applied to the subtractor 8 are equal), and by automatically equalizing the sensitivity (the upper value) in the ranges by discretely varying the transmission coefficient of the resistor dividers of the measuring sensitivity control unit 13. Apparently, in case of replacing the thickness gauge or changing the type of article under investigation, the adjustment of the device boils down to forming reference voltages and setting desired transmission coefficients of the resistor dividers of the measuring sensitivity control unit 13. When integrators are used, the storing of output voltages $U_{b1}$ (FIG. 6), $U_{b2}$, $U_{b3}$, $U_{b4}$ of the peak detector 4 (FIG. 1) boils down to the simple operation of successively placing the thickness gauge 2 on standard coatings for a given base. Without the necessity of adjusting the measuring sensitivity control unit 13, the device is adjusted and calibrated by simply reading off and writing a few discrete values of voltages at the output of the peak detector 4.

The embodiment of FIG. 2 features further improvements in the measuring process, as well as further steps aimed at automating thickness measurements and equalizing sensitivities within different measurement ranges irrespective of the type of relationship between the output voltage of the peak detector 4 and the coating thickness. As in the case of the first embodiment of the invention, let it now be assumed that the measurement error value due to the nonlinearity of the characteristic curve is not beyond permissible limits, provided that the entire coating thickness range $H_n$ is divided into three equal positions or ranges $H_o$ (FIG. 6). As pointed out above, the mean sensitivity in each range is as follows:

$$\gamma_1 = \frac{\Delta U_1}{H_o} > \gamma_2 = \frac{\Delta U_2}{H_o} > \gamma_3 = \frac{\Delta U_3}{H_o}, \text{ and}$$
$$\Delta U_1 = U_{b1} - U_{b2} > \Delta U_2 = U_{b2} - U_{b3} > \Delta U_3 = U_{b3} - U_{b4}.$$

The problem of measuring the actual thickness value boils down to finding the serial number n of the working ranges I, II, III and the thickness value in the range $\Delta H$, i.e.

$$H = (n-1)H_o + \Delta H_o.$$

Let it be assumed that $n=1$, $\Delta H = H_o/2$, and that the actual voltage level at the output of the peak detector 4 is $U_{c1}$. Let it further be assumed that $n=2$, and $\Delta H = H_o/2$ at an actual voltage level $U_{c2}$ at the output of the peak detector 4. For both cases the actual thickness value is expressed as follows:

$$H_1 = \Delta H = \frac{H_o}{2} \text{ and } H_2 = H_o + \Delta H = \frac{3}{2} H_o.$$

If the dependencies $\Delta U_{c1}/\Delta U_1$ and $\Delta U_{c2}/\Delta U_2$ are used for thickness measurements within ranges instead of $U_{b1} - U_{c1} = \Delta U_{c1}$ and $U_{b2} - U_{c2} = \Delta U_{c2}$ as in the case under review, it follows that irrespective of the relationship between U and H and within each range $$H_1 = \frac{H_o}{2} \text{ and } H_2 = \tfrac{3}{2} H_o \text{ because}$$
$$\frac{\Delta U_{c1}}{\Delta U_1} = \frac{\Delta U_{c2}}{\Delta U_2} = \frac{H_o}{2}.$$

It follows from the above that by appropriately changing the signals $\Delta U_{c1}$, $\Delta U_{c2}$ and $\Delta U_{c3}$ from 0 to $\Delta U_{c1}$, $\Delta U_{c2}$ and $\Delta U_{c3}$, it is possible to vary their ratios K from very small values (0) to 1 irrespective of the working range. Hence, in each range $$\frac{\Delta U_{c1}}{\Delta U_1} = \frac{U_{b1} - U_{c1}}{U_{b1} - U_{b2}}, \frac{\Delta U_{c2}}{\Delta U_2} = \frac{U_{b2} - U_{c2}}{U_{b2} - U_{b3}}, \text{ etc.}$$

Irrespective of the range, the mean sensitivity is as follows:

$$\gamma = 1/H_o = \text{const}$$

Thus to determine the thickness $\Delta H$ within a working range (range II according to FIG. 6), one can use this equation:

$$\gamma = K_o/\Delta H,$$

where $K_o$ is the ratio between voltages and wherefrom $$\Delta H = K_o \gamma = C_o K_o,$$

where $C_o$ is the constant coefficient.

With the use of a single voltage dividing circuit for all the ranges, the numerical value $\gamma$ of sensitivity will always be the same in any range and may, if necessary, be varied according to the scale of the ratio between voltages. This method of equalizing the sensitivity is used in the embodiment of FIG. 2 and makes it possible to dispense with adjustment and calibration of the device because $\gamma = 1/H_o$, which means that the sensitivity is independent of the scale and type of relationship between the output voltage of the peak detector 4 and the coating thickness (provided the dependence of U upon H is of the decreasing type). Apart from the foregoing considerations, the utilization of the voltages ratio principle helps to improve the accuracy of measurements by reducing the instrument error, because it rules out the effects of the unstable transmission coefficients of data processing circuits, which are common for the numerator and denominator of the ratio between voltages, as well as the effects of factors which account for symmetrical variations in coefficients for circuits of similar configurations, such as subtractors.

Consider the process of measuring the coating thickness $\Delta H$ within a range in greater detail. If the working signal at the output of the peak detector 4 (FIG. 2) corresponds to the first range, $\Delta H$ is found by solving this equation:

$$K_o = \frac{U_{b1} - U_{c1}}{U_{b1} - U_{b2}}.$$

If the signal at the output of the peak detector 4 corresponds to the second or third ranges, it is necessary to solve these respective equations:

$$K_o = \frac{U_{b2} - U_{c2}}{U_{b2} - U_{b3}}; K_o = \frac{U_{b3} - U_{c3}}{U_{b3} - U_{b4}}.$$

This means that for each measurement range, the actual voltage level of the peak detector 4 (which is $U_{c1}$ for range I) must be subtracted from the upper level (which is $U_{b1}$ for range I). The difference is applied to one of the inputs of the voltage dividing circuit of the measuring sensitivity control unit 13. The lower level of the working measurement range (which is $U_{b2}$ for range I) is then subtracted from the upper level, and the difference is applied to the second input of the voltage dividing circuit of the measuring sensitivity control unit 13.

These voltages are switched by signals arriving from the automatic measurement range switching unit 6, which are applied to the input of the unit 20 for discriminating the upper level of the working measurement range and the input 24 of the unit 23 for discriminating the lower level of the working measurement range. Either of the units 20 and 23 is a three-channel controlled electronic switch built around field-effect transistors with p-channels (these switches are similar to the electronic switch 41 of the automatic measurement range switching unit 6, shown in FIG. 3). The subtractors 8 and 27 are operational amplifiers. It follows that if the first range is selected, for example, voltage $U_{b1}$ (FIG. 6) is applied to the input 22 of the subtractor 8, whereas voltage of the peak detector 4 is applied to its second input 7 (FIG. 2). The difference $U_{b1} - U_{c1}$ is produced at the output 16 of the subtractor 8; it is negative in polarity and is applied to one of the inputs of the measuring sensitivity control unit 13. Accordingly, voltage $U_{b2}$ is applied to the input 26 of the subtractor 27, whereas voltage $U_{b1}$ is applied to the second input 28 of said subtractor 27. At the output 29 of the subtractor 27 there is produced the difference $U_{b1} - U_{b2}$ of positive polarity and applied to the second input of the measuring sensitivity control unit 13. From the output 17 of the measuring sensitivity control unit 13, voltage of a magnitude proportional to the coating thickness of the article under investigation is applied in the working range $\Delta H$ to the input of the adder 15. The following sequence of events is like that described above.

In most cases the coating-base combinations are such that the dependence of the output voltage U of the peak detector 4 on the thickness H of the coating decreases with an increase in the coating thickness, which means that the derivative dU/dH is a negative value.

The above emobdiments of the device according to the invention are readily applicable to such cases. The second embodiment of the invention is marked by expanded functional potentialities due to the fact that it is provided with a unit 30 for compensating the effects of the derivative sign of the thickness gauge characteristic. With a negative derivative the output signal of the peak detector unit 4 is applied to one of the inputs of the unit 30 for compensating the effects of the derivative sign. As the second input of the compensation unit 30 receives no compensating voltage from the reference voltage forming unit 10, the signal of the peak detector unit 4 is fed from the output of the compensation unit 30 to the input of reference voltage forming unit 10, the input 5 of the automatic measurement range switching unit 6 and to the input 7 of the subtractor 8 without any alterations. With a positive derivative compensating voltage is supplied to the second input of the compensation unit 30 from the reference voltage forming unit 10 and in this way the output characteristic of the gauge is inverted (the sign of the derivative is reverted). The unit 30 for compensating the effects of the derivative sign of the thickness gauge characteristic features a conventional circuitry (cf. G.Marchais, "Operatsionnye usiliteli i ikh primeneniye"/"Operational Amplifiers and Their Uses"/, Energia Publishers, Leningrad, 1974, pp. 62, 64).

Figure 4:
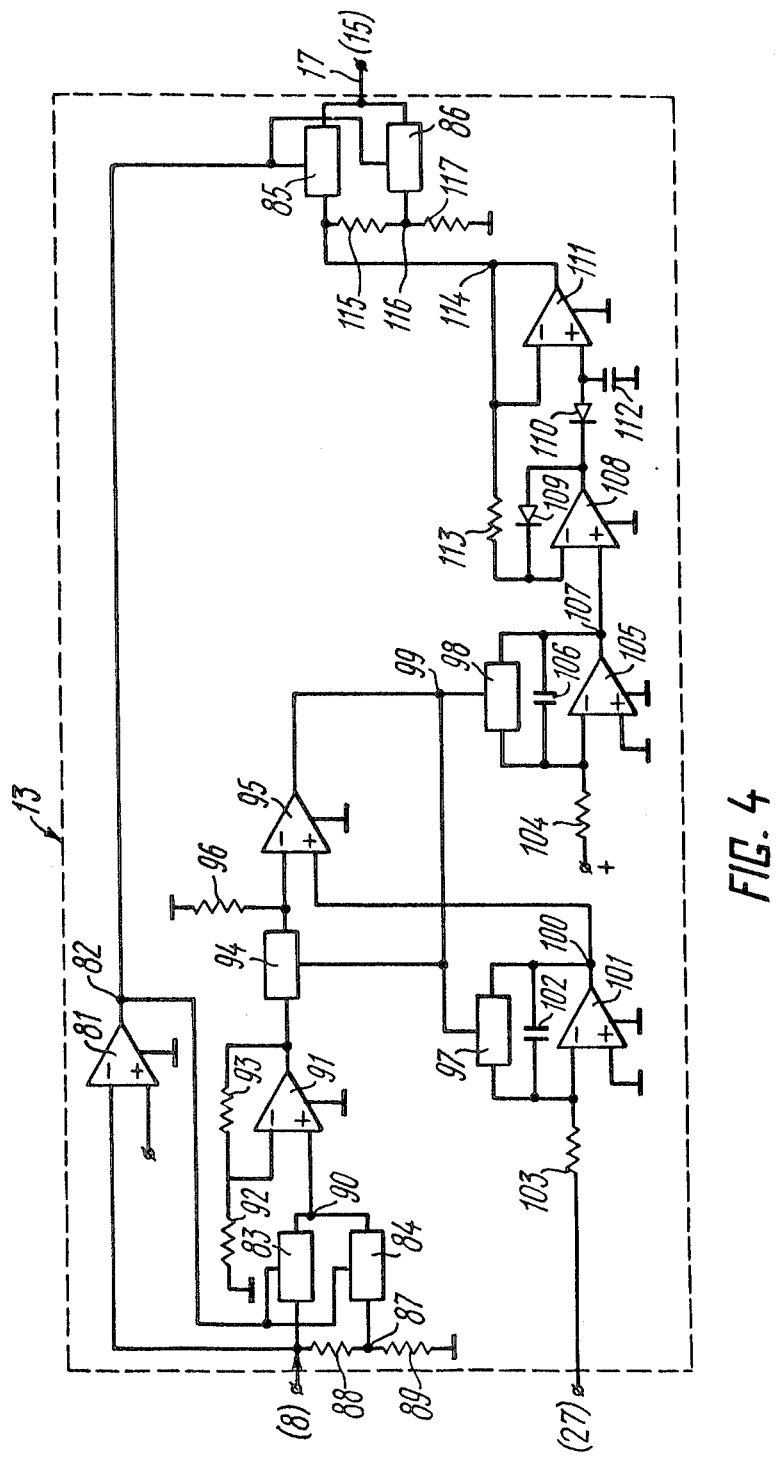
FIG. 4 is a key diagram of the measuring sensitivity control unit incorporated in the device, according to the invention.

Consider operation of the measuring sensitivity control unit 13 (FIG. 4). The threshold elements of this unit are built around the operational amplifiers 81 and 95, while the voltage integrators are built around the operational amplifiers 101 and 105. The peak detector is built around the operational amplifiers 101 and 111 and operates exactly like the peak detector 4 described above with reference to the embodiment of FIG. 3.

Figure 7:
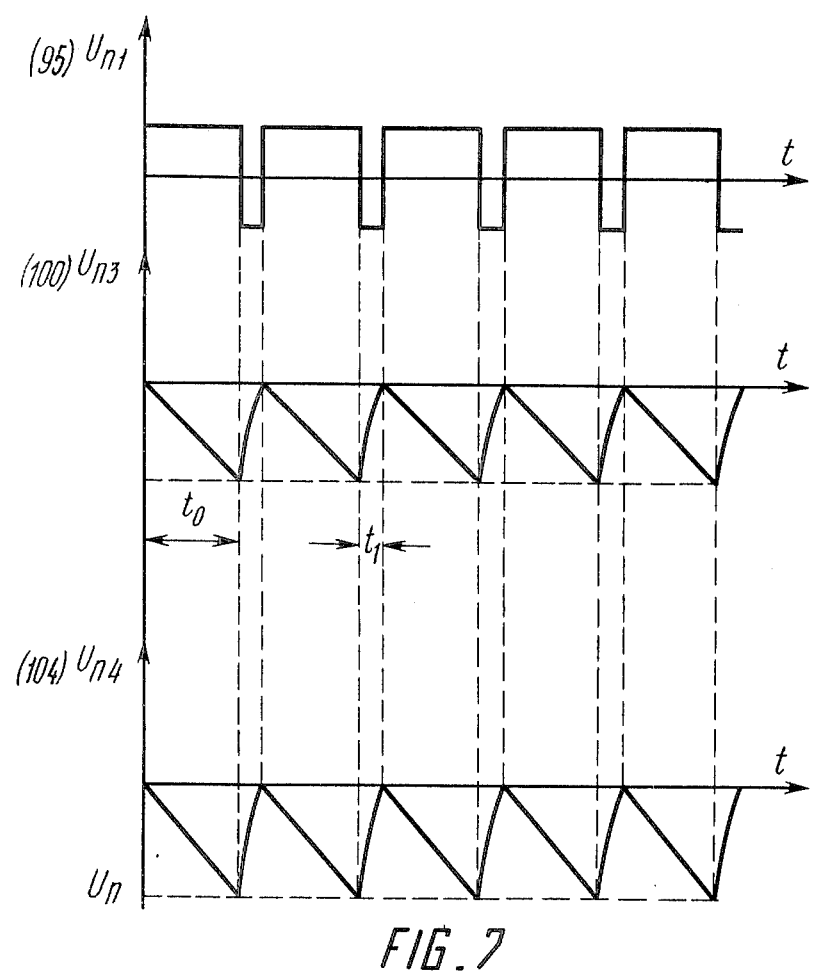
FIG. 7 shows voltage-time plots of the outputs of the threshold elements and two integrators of the measuring sensitivity control unit, in accordance with the invention.

A better understanding of operation of the device for measuring the thickness of coatings according to the invention will be had from a consideration of FIG. 7 which shows time plots of voltages $U_{n1}$, $U_{n3}$ and $U_{n4}$ across the outputs of the operational amplifiers 95, 101 and 105, respectively.

For example, when the first range is switched on, voltage $U_{b1}-U_{c1}$ of negative polarity is applied from the output of the subtractor 8 to the input of the single-channel electronic switch 83, and voltage $U_{b1}-U_{b2}$ of positive polarity is applied from the output of the subtractor 27. In the initial state, at the output of the operational amplifier 95, which serves as the threshold element, there is voltage $U_{n1}$ (FIG. 7) of positive polarity, which is applied to the control input of the electronic switch 94 (FIG. 4) built around a field-effect transistor with an n-channel. At the output 82 of the operational amplifier 81 there is also produced voltage of positive polarity, because that voltage $U_{b1}-U_{c1}$ is greater than voltage $U_{n2}$ applied to the non-inverting input of the operational amplifier 81. The voltage $U_{n2}$ is applied to the control inputs of the electronic switches 84, 85 which are also built around field-effect transistors with n-channels. Thus applied to the inverting input of the operational amplifier 95 is voltage $U_{b1}-U_{c1}$ which is reduced by the input voltage divider built around the resistors 88, 89. The electronic switches 83, 86, 97 and 98 built around p-type field-effect transistors are cut off.

Voltage $U_{b1}-U_{b2}$ arrives the output of the resistor 103 and is applied to the input of the integrator built around the operational amplifier 101. Voltage $U_{n3}$ (FIG. 7) is of negative polarity; it is applied from the output of the operational amplifier 101 (FIG. 4) to the non-inverting input of the operational amplifier 95. Voltage of positive polarity of the reference voltage source arrives to the output of the resistor 103 and is applied to the input of the integrator built around the operational amplifier 105 at whose output there is produced linearly increasing voltage $U_{n4}$ (FIG. 7) of negative polarity.

As the voltages at the inputs of the operational amplifier 95 (FIG. 4) become equal, the polarity of voltage $U_{n1}$ at its output 99 is reversed; the switch 94 is rendered non-conducting, whereas the switches 97 and 98 are driven into conduction. The capacitors 102 and 106 start discharging. The inverting input of the operational amplifier 95 is grounded via the resistor 96. Thus the operational amplifier 95 is used as a threshold element which ensures a complete discharge of the capacitor 102. The capacitor 106 goes on discharging at the same time ($t_1$, FIG. 7). To ensure complete discharge of the capacitor 106, its capacity is selected to be somewhat less than that of the capacitor 102. As the capacitor 102 is fully discharged, the above sequence of events is repeated.

The outpt voltage $U_{n3}$ at the output of the operational amplifier 101 varies as follows:

$$U_{n3} = (U_{b1} - U_{b2})\frac{t}{\tau},$$

where t is time and $\tau$ is the time constant of the integrator.

As the voltages at the input of the operational amplifier 95 become equal, $$(U_{b1} - U_{b2})\frac{t_o}{\tau} = (U_{b1} - U_{c1})K_1,$$

where $K_1$ is the transmission coefficient of the resistor divider built around the resistors 88 and 89, multiplied by the transmission coefficient of the operational amplifier 91, $t_o$ is t at the instant of switching. It follows that $$t_o = \frac{(U_{b1} - U_{c1})}{U_{b1} - U_{b2}} \cdot K_1\tau.$$

Thus $t_o$ is proportional to the ratio of voltages being measured. If the voltage $E_o$ applied to the output of the resistor 104 is constant, the integrator built around the operational amplifier 105 is used to convert $t_o$ to proportional voltage.

The output voltage at the output 106 of the operational amplifier 105 can be expressed as follows:

$$U_{n4} = E_o \cdot \frac{t_o}{\tau_1},$$

where $\tau_1$ is the time constant of the integrator built around the operational amplifier 106. With due regard for the value of $t_o$:

$$U_{n4} = \frac{(U_{b1} - U_{c1}) \cdot E_o \cdot K_1 \cdot \tau}{(U_{b1} - U_{b2})\tau_1}.$$

After the pulsation is smoothed down by the peak detector built around the operational amplifiers 108 and 111, the voltage at the output of said peak detector is: $U_n \approx U_{n4}$ (FIG. 7).

From the output of the peak detector, voltage is applied to the input of the output resistor voltage divider built around the resistors 115 (FIG. 4) and 117 and follows via the electronic switches 85 and 86 to the common output 17 of the measuring sensitivity control unit 13. With due regard for the transmission coefficient $K_2$ of the resistor divider built around the resistors 115 and 117, the voltage across the output 17 of the measuring sensitivity control unit 13 is as follows:

$$U_{output} = \frac{(U_{b1} - U_{c1}) K_2 \cdot K_1 \cdot \tau \cdot E_o}{(U_{b1} - U_{b2})_1}.$$

In order to avoid changes in the coefficient $$C_o = \frac{K_1 \cdot K_2 \cdot \tau \cdot E_o}{\tau_1}$$

in the course of operation, the resistors 88, 89, 115 and 117 must be switched so as to meet this condition:

$$K_1 \cdot K_2 = \text{const}.$$

When liberating the device, it is best to change $C_o$ by varying $E_o$. Thus the voltage at the output 17 of the measuring sensitivity control unit 13 is proportional to the ratio between the input voltages.

So far we have considered the division of voltage $U_{b1} - U_{c1} > U_{n2}$ ($U_{n2}$ being voltage applied to the non-inverting input of the operational amplifier 81). To avoid certain complications with small values of voltage $U_{b1} - U_{c1}$ (for example, when $U_{b1} - U_{c1} < U_{n2}$), it is necessary to reverse the input and output voltage dividers built around the resistors 88, 89, 115 and 117, but it must be done so that $K_1 \cdot K_2 = \text{const}$, the resistive divider built around resistors 88, 89 should not reduce $U_{b1} - U_{c1}$. This end is achieved with the aid of the operational amplifier 81. The polarity of voltage at the output 82 of said operational amplifier 81 is reversed, and the pair of switches 83 and 86, built around field-effect transistors with p-channels, is driven into conduction through their control inputs. Thus there is brought about an expansion of the dynamic range of the measuring sensitivity control unit 13. It is notable that the unit 13 is marked by an increased accuracy, which is due to the fact that the threshold element built around the operational amplifier 95 is used to monitor both the upper and zero levels of voltages being compared.

The dynamic range can further be expanded by replacing the single threshold element built around the operational amplifier 81 by a group of similar threshold elements in combination with multisectional resistor voltage dividers at the inputs and outputs. The conversion may be effected through the other input and output of the measuring sensitivity control unit 13 or through both inputs simultaneously.

Due to its original design and the use of integrated microcircuits, the device of the present invention features an improved accuracy of measurements, provides for automatic selection and switching of measurement ranges, makes it possible to arbitrarily select the beginning and end of a working range, and linearizes nonlinear dependences.

The device is applicable to all kinds of coating-base combinations through an appropriate selection of the type of the thickness gauge. For example, with the use of an electromagnetic thickness gauge one can measure the thickness of dielectric coatings on any metal and the thickness of current-carrying coatings on articles of ferromagnetic materials, and even solve such a complicated problem as the measurement of thicknesses of a variety of nonmagnetic conducting coatings on articles of nonmagnetic conducting materials.

Due to the use of the unit for compensating the effects of the derivative sign of the thickness gauge characteristic, the device of the present invention is operable with both increasing and decreasing nonlinear characteristics. This means that apart from measuring the thickness of coatings, the device according to the invention can also be used for measuring the thickness of manufactured articles, such as sheet materials. One of the alternative embodiments of the invention presupposes the use of two devices of the type described above for measuring the thickness of rolled band. For this purpose, the thickness gauges are arranged on both sides of the band whose thickness is to be measured. The gauges are rigidly secured and spaced at a certain distance from the band's surface. The air gap between the gauge and the respective upper or lower band surface is measured. Given the distance between the gauges and the width of the two air gaps, it is easy to find the thickness of the rolled band. No interference on the part of the operator is required even in case of switching over to different band thicknesses, as the device automatically selects the necessary working range.

The device according to the invention displays the thickness of a coating being measured, presented in the decimal or some other code, in micrometers. It also features data input to numeric printers, computers or automatic control systems. If necessary, the device may give an alarm signal whenever the thickness of the coating being measured exceeds prescribed limits, which means, in fact, active control of production processes.

What is claimed is:

1. A device for measuring the thickness of coatings, comprising:
    an electric signal generator having an output;
    a thickness gauge having an input connected to said output of said electric signal generator, and an output;
    a conversion circuit for converting an electric signal at said output of said thickness gauge to an electric signal of a magnitude proportional to the coating thickness being measured, having an input connected to said output of said thickness gauge, and an output;
    a peak detector of said conversion circuit, having an input which serves as said input of said conversion circuit, and an output;
    an automatic measurement range switching unit of said conversion circuit, having a first input electrically coupled to said output of said peak detector, a second input and a first, second, and third output;
    a reference voltage forming unit of said conversion circuit, having an output connected to said second input of said automatic measurement range switching unit;
    a subtractor of said conversion circuit, having a first input electrically coupled to said output of said peak detector, a second input electrically coupled to said first output of said automatic measurement range switching unit, and an output;
    a measuring sensitivity control unit of said conversion circuit, having a first input connected to said output of said subtractor, a second input electrically coupled to said second output of said automatic measurement range switching unit, and an output;

an adder of said conversion circuit, having a first input connected to said output of said measuring sensitivity control unit and a second input connected to said third output of said automatic measurement range switching unit, and an output which serves as said output of said conversion circuit;

a recorder having an input connected to said output of said adder.

2. A device as claimed in claim 1, comprising:

an input and second and third outputs of said reference voltage forming unit;

a unit for discriminating the upper level of the working measurement range of said conversion circuit, having a first input connected to said first output of said automatic measurement range switching unit, a second input connected to said second output of said reference voltage forming circuit, and an output connected to said input of said subtractor;

a unit for discriminating the lower level of the working measurement range of said conversion circuit, having a first input connected to said third output of said reference voltage forming unit, a second input connected to said second output of said automatic measurement range switching unit, and an output;

a second subtractor of said conversion circuit, having a first input connected to said output of said unit for discriminating the upper level of the working measurement range, a second input connected to said output of said unit for discriminating the lower level of the working measurement range, and an output connected to said second input of said measuring sensitivity control unit;

said output of said peak detector being electrically coupled to said input of said reference voltage forming unit;

said measuring sensitivity control unit being built around a voltage divider.

3. A device as claimed in claim 2, wherein said measuring sensitivity control unit comprises:

a double-section input voltage divider having an input which serves as said first input of said measuring sensitivity control unit;

two single-channel input electronic switches of different types of conductivity, each having an input connected to a respective section of said input voltage divider, a control input and an output;

a first threshold element having a first input connected to said input of said input voltage divider, an output connected to said control inputs of said single-channel input electronic switches, and a second input;

a first reference voltage source having an output connected to said second input of said first threshold element;

a signal amplifier having an input connected to said outputs of said single-channel input electronic switches and an output;

a single-channel electronic switch having an input, a control input and an output, said input being connected to said output of said signal amplifier;

a second threshold element having a first input connected to said output of said single-channel electronic switch, an output connected to said control input of said single-channel electronic switch, and a second input;

a first integrator with a negative feedback loop, having an input which serves as said second input of said measuring sensitivity control unit, a control input connected to said output of said second threshold element, and an output connected to said second input of said second threshold element;

a first electronic switch connected in said negative feedback loop of said first integrator, having a control input which serves as said control input of said first integrator;

a second integrator with a negative feedback loop, having an input, a control input and an output, and connected by said control input to said output of said second threshold element;

a second reference voltage source having an output connected to said input of said second integrator;

a second electronic switch connected in said negative feedback loop of said second integrator, having a control input which serves as said control input of said second integrator;

a peak detector having an input connected to said output of said second integrator, and an output;

a double-section output voltage divider having an input connected to said output of said peak detector;

two single-channel output electronic switches of different types of conductivity, each having an input connected to a respective section of said output voltage divider, a control input connected to said output of said first threshold element, and an output combined with said output of said second single-channel output electronic switch and serving as said output of said measuring sensitivity control unit.

4. A device as claimed in claim 2, comprising:

a unit for compensating the effects of the derivative sign of the characteristic of said thickness gauge of said conversion circuit, having a first input connected to said output of said peak detector, an output connected to said inputs of said first subtractor, automatic measurement range switching unit and reference voltage forming unit, and also having a second input;

a fourth output of said reference voltage forming unit, connected to said second input of said unit for compensating the effects of the derivative sign of the characteristic of said thickness gauge.

* * * * *